US012777896B2

(12) United States Patent
Chiang et al.

(10) Patent No.: US 12,777,896 B2
(45) Date of Patent: Oct. 27, 2026

(54) METHOD FOR DETECTING SEAM IN FILM

(71) Applicant: Winbond Electronics Corp., Taichung City (TW)

(72) Inventors: Chih-Yu Chiang, Taichung City (TW); Chi-Hung Chan, Taichung City (TW)

(73) Assignee: Winbond Electronics Corp., Taichung City (TW)

( * ) Notice: Subject to any disclaimer, the term of this patent is extended or adjusted under 35 U.S.C. 154(b) by 400 days.

(21) Appl. No.: 18/395,740

(22) Filed: Dec. 26, 2023

(65) Prior Publication Data

US 2024/0213102 A1 Jun. 27, 2024

(30) Foreign Application Priority Data

Dec. 26, 2022 (TW) ................................ 111150026

(51) Int. Cl.

| | |
|---|---|
| ***G06T 7/00*** | (2017.01) |
| ***G06T 7/11*** | (2017.01) |
| ***G06T 7/73*** | (2017.01) |
| ***H10P 74/20*** | (2026.01) |

(52) U.S. Cl.

CPC ............ *H10P 74/203* (2026.01); *G06T 7/001* (2013.01); *G06T 7/11* (2017.01); *G06T 7/74* (2017.01); *H10P 74/207* (2026.01); *G06T 2207/10056* (2013.01); *G06T 2207/30148* (2013.01)

(58) Field of Classification Search

CPC ...... H10P 74/203; H10P 74/207; G06T 7/001; G06T 7/11; G06T 7/74; G06T 2207/10056; G06T 2207/30148; G06T 2207/10061; G06T 7/0004

See application file for complete search history.

(56) References Cited

U.S. PATENT DOCUMENTS

| | | | | |
|---|---|---|---|---|
| 8,126,259 | B2 * | 2/2012 | Shimura | G06T 7/001 716/112 |
| 10,539,612 | B2 | 1/2020 | Duffy | |
| 10,672,588 | B1 | 6/2020 | Pathangi et al. | |
| 2002/0037622 | A1 * | 3/2002 | Chan | H10W 20/081 438/301 |
| 2004/0150813 | A1 * | 8/2004 | Kim | G01N 21/9501 356/237.1 |

(Continued)

FOREIGN PATENT DOCUMENTS

| | | |
|---|---|---|
| CN | 111179243 | 5/2020 |
| CN | 111638226 | 8/2021 |

*Primary Examiner* — Van D Huynh

(74) *Attorney, Agent, or Firm* — JCIPRNET

(57) ABSTRACT

A method for detecting a seam in a film is provided. The following process is performed on a film in a first wafer: (a) a scan is performed to obtain a gray level image; (b) a region positioning process is performed on the gray level image to define target regions and a seam region located in each target region; (c) a gray level value of each pixel in each seam region is obtained, and the number of pixels whose gray level values are lower than a gray level threshold value in each seam region is calculated; (d) a pixel quantity threshold value is generated according to the number in each seam region. Then, the process (a) to (c) is performed on a film in a second wafer, and a seam region having the number exceeding the pixel quantity threshold value is determined to be a defect region.

11 Claims, 2 Drawing Sheets

(56) References Cited

U.S. PATENT DOCUMENTS

| | | | | |
|---|---|---|---|---|
| 2006/0159333 | A1* | 7/2006 | Ishikawa | G06T 7/001<br>382/149 |
| 2006/0197090 | A1* | 9/2006 | Huang | H10D 1/692<br>257/E27.071 |
| 2007/0049038 | A1* | 3/2007 | Schrinksy | H10B 12/033<br>257/E21.311 |
| 2009/0196490 | A1* | 8/2009 | Matsumiya | G06T 7/001<br>382/149 |
| 2017/0200264 | A1* | 7/2017 | Park | G01N 21/9501 |
| 2022/0115275 | A1 | 4/2022 | Pandit et al. | |
| 2022/0326162 | A1* | 10/2022 | Wang | G01N 21/9501 |

* cited by examiner

METHOD FOR DETECTING SEAM IN FILM

CROSS-REFERENCE TO RELATED APPLICATION

This application claims the priority benefit of Taiwan application serial no. 111150026, filed on Dec. 26, 2022. The entirety of the above-mentioned patent application is hereby incorporated by reference herein and made a part of this specification.

BACKGROUND

Technical Field

The disclosure relates to a method for detecting a defect, and particularly relates to a method for detecting a seam in a film.

Description of Related Art

In the semiconductor manufacturing process, during filling a material into a trench, the material may not be able to completely fill the trench and a seam is generated in the formed material layer. The seam affects electrical properties of the subsequently formed semiconductor component.

In the current method for detecting a seam, a transmission electron microscope is mostly used to directly detect the film. In this way, excessive wafer wastage is caused and excessive detection time is consumed. In addition, due to the long time of the transmission electron microscope detection, the production line has to be stopped, resulting in reduced production capacity.

Therefore, how to effectively detect seams without being too time-consuming or affecting production capacity is one of the important issues at present.

SUMMARY

The disclosure provides a method for detecting a seam in a film, which can instantly and quickly determine whether a seam region is a defect region.

A method for detecting a seam in a film of the disclosure includes the following. The following process is performed on a film in a first wafer: (a) a scan is performed to obtain a gray level image; (b) a region positioning process is performed on the gray level image to define a plurality of target regions and a seam region located in each target region; (c) a gray level value of each pixel in each seam region is obtained, and the number of pixels whose gray level values are lower than a gray level threshold value in each seam region is calculated; (d) a pixel quantity threshold value is generated according to the number of pixels whose gray level values are lower than the gray level threshold value in each seam region. Steps (a) to (c) are performed on a film in a second wafer, and a seam region having the number of pixels whose gray level values are lower than the gray level threshold value exceeding the pixel quantity threshold value is determined to be a defect region.

Based on the above, in the method for detecting the seam in the disclosure, the defect is detected through the gray level image, and the seam region can be instantly and quickly determined without taking out the wafer to perform transmission electron microscope detection. Therefore, seam detection can be continuously performed on a batch of wafers in the semiconductor production line without stopping the production line, and whether the seam region is the defect region causing an electrical defect can be accurately determined.

DESCRIPTION OF THE EMBODIMENTS

With the miniaturization of semiconductor devices, in a semiconductor manufacturing process, a seam may form in a film during the formation of each film in a semiconductor wafer. When the seam is too large, an electrical defect may be caused. For example, for a conductive layer embedded in a dielectric layer, generally, a trench or via is formed in the dielectric layer first, and then a conductive material is filled into the trench or via to form the conductive layer. Due to the depth of the trench or via being too deep or other manufacturing process factors, the conductive material may not be able to completely fill a trench, so the seam is present in the formed conductive layer. Therefore, the disclosure proposes a method for detecting a seam that can accurately detect the seam without interrupting the manufacturing process.

Figure 1:
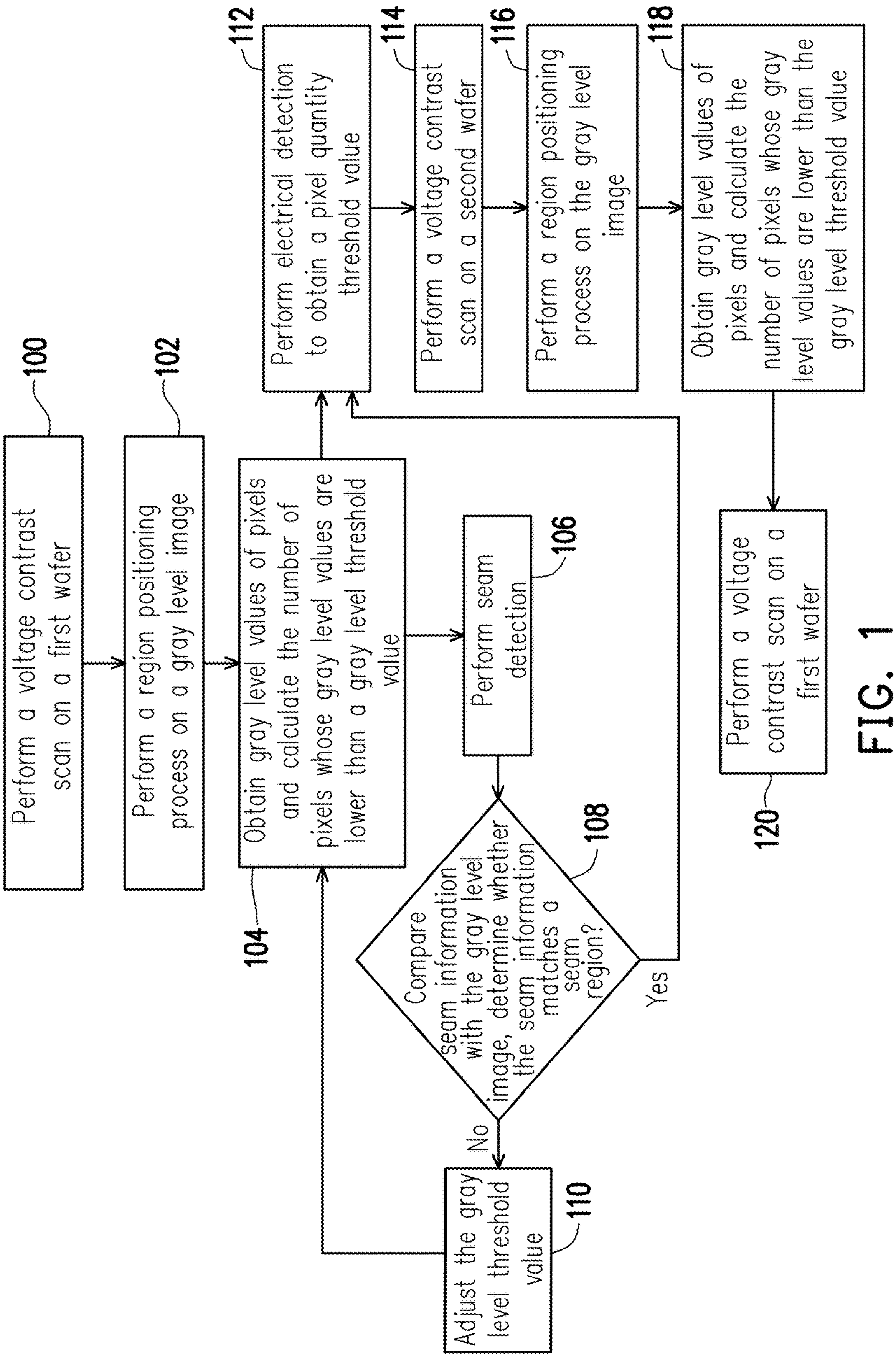
FIG. 1 is a flowchart of a method for detecting a seam in a film according to an embodiment of the disclosure.

FIG. 1 is a flowchart of a method for detecting a seam in a film according to an embodiment of the disclosure. In this embodiment, a first wafer may be any wafer in a batch of wafers in a semiconductor production line, and a second wafer is another wafer in the batch of wafers. Therefore, the first wafer and the second wafer are wafers manufactured in the same batch and have the same predetermined structure. In addition, as an example, a polysilicon layer embedded in a dielectric layer is formed in the first wafer and may serve as a bit line contact.

Figure 2:
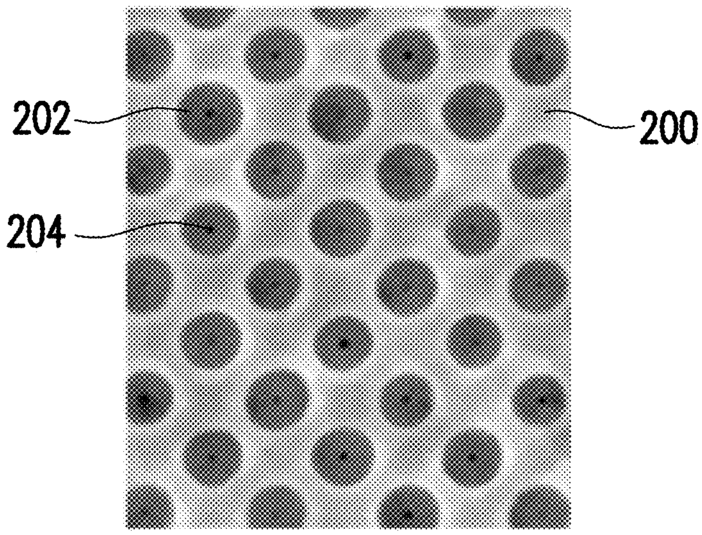
FIG. 2 is a gray level image obtained by performing a voltage contrast scan on a wafer in an embodiment of the disclosure.

Referring to FIG. 1, in Step 100, after a film to be detected (such as the polysilicon layer embedded in the dielectric layer) is formed on the first wafer, a voltage contrast scan is performed on the first wafer to obtain a gray level image. The voltage contrast scan can acquire structural conditions of a scanning target and present the structural conditions in the form of gray level images. In detail, in this embodiment, after the voltage contrast scan is performed on the dielectric layer and the polysilicon layer embedded in the dielectric layer in the first wafer, the gray level image as shown in FIG. 2 may be obtained. Referring to FIG. 2, a dielectric layer 200 has a high gray level value, a seam 204 has a low gray level value, and a polysilicon layer 202 has a gray level value in between. It can be seen from FIG. 2 that the polysilicon layer 202 is located in the dielectric layer 200 and the seam 204 is present in the polysilicon layer 202.

Figure 3:
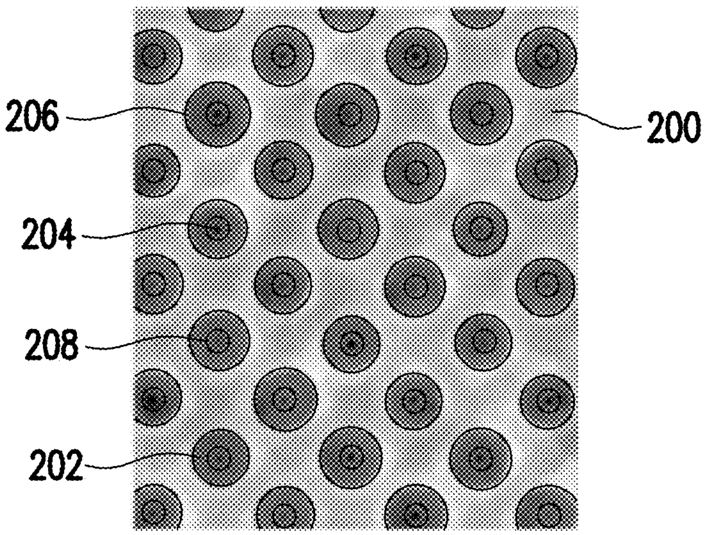
FIG. 3 is a result of performing a region positioning process on the gray level image in FIG. 2.

Next, in Step 102, a region positioning process is performed on the gray level image obtained in Step 100, so as to define a plurality of target regions and a seam region located in each target region. As shown in FIG. 3, in the region positioning process, a boundary of the polysilicon layer 202 is clearly marked to define a target region 206, and a boundary of the seam 204 is clearly marked to define a seam region 208. The disclosure does not limit the means of the region positioning process, as long as the defined target region 206 and seam region 208 may be clearly identified in subsequent steps without being disturbed by surrounding regions.

For example, in Step 102, by comparing an original design drawing of the film to be detected with the gray level image and according to a boundary of the polysilicon layer 202 in the original design drawing of the film to be detected, a boundary of the polysilicon layer 202 in the gray level image may be defined. In this way, a misjudgment of the boundary caused by random noise in the gray level image can be reduced. The original design drawing is, for example, stored in a form of a CAD file, but the disclosure is not limited thereto.

Next, in Step 104, a gray level value of each pixel in each seam region 208 is obtained according to the gray level image. Then, the gray level value of each pixel is compared with a predetermined gray level threshold value to calculate the number of pixels whose gray level values are lower than the gray level threshold value in each seam region 208. In this embodiment, the number of pixels whose gray level values are lower than the gray level threshold value may be expressed as a size of the seam region 208. For example, when a size of each pixel is 1 square nanometer, the number n of pixels whose gray level values are lower than the gray level threshold value may be regarded as the size (n square nanometers) of the seam region 208, but the disclosure is not limited thereto. In addition, the gray level threshold value may adopt an empirically estimated value or the gray level threshold value may be corrected by performing a subsequent processing.

Alternatively, correction processing may be performed on the gray level threshold value.

In Step 106, seam detection is performed on the first wafer to obtain seam information. In this step, transmission electron microscope detection may be performed on the first wafer to obtain the seam information including at least a seam position. Then, in Step 108, the seam information is compared with the gray level image to determine whether these two match.

In detail, when the seam position obtained from the seam information does not match the seam region 208 in the gray level image, Step 110 must be performed to adjust the gray level threshold value. In Step 110, if there is no seam at a certain position obtained from the seam information but the gray level value of the pixel at a relative position in the gray level image is lower than the gray level threshold value, it means that the predetermined gray level threshold value is too high and must be adjusted to a lower value. If there is a seam at a certain position obtained from the seam information but the gray level value of the pixel at a relative position in the gray level image is not lower than the gray level threshold value, it means that the predetermined gray level threshold value is too low and must be adjusted to a higher value. After adjusting the gray level threshold value, return to Step 104. The gray level value of each pixel is compared with a corrected gray level threshold value to calculate the number of pixels whose gray level values are lower than the corrected gray level threshold value in each seam region 208. In this way, it can be ensured that the gray level image can correctly correspond to the seams in the film.

When the seam information matches the seam region, the predetermined gray threshold value is maintained and no correction is needed. Next, Step 112 is performed.

On the other hand, in a case that the predetermined gray level threshold value is a known proper value, after Step 104, Steps 106 to 110 may be omitted. Next, Step 112 is performed.

After calculating the number of pixels whose gray level values are lower than the predetermined gray level threshold value or the corrected gray level threshold value in each seam region 208, in Step 112, electrical detection is performed on the first wafer to obtain an electrical defect distribution diagram. According to the electrical defect distribution diagram, the gray level image, and the number of pixels whose gray level values are lower than the predetermined gray level threshold value or the corrected gray level threshold value in each seam region 208, seam positions that affect electrical properties can be known. That is to say, in the first wafer, for all seams, not every seam may affect the electrical properties or the impact of some seams is so low that the impact may be ignored. Therefore, the seam region 208 that affects the electrical properties may be identified through the electrical detection.

In addition, the electrical defect distribution diagram is compared with the seam regions 208 to obtain a pixel quantity threshold value. In detail, in Step 104, the size of the seam region 208 is defined by the number of pixels whose gray level values are lower than the gray level threshold value, so that each seam region 208 has a quantitative value (that is, the number of pixels whose gray level values are lower than the gray level threshold value) representing the size. Therefore, in the process of comparison, the quantitative value representing the size of the seam region 208 that affects the electrical properties and the quantitative value representing the size of the seam region 208 that does not affect the electrical properties may be classified, that is, the size of the seam region 208 may be classified to obtain the pixel quantity threshold value. In other words, when the quantitative value representing the size of the seam region 208 does not exceed the pixel quantity threshold value (the size of the seam region 208 is smaller), the seam region 208 does not cause electrical defects. When the quantitative value of the seam region 208 exceeds the pixel quantity threshold value (the size of the seam region 208 is larger), the seam region 208 causes electrical defects. The pixel quantity threshold value is the criterion for determining whether the seam region 208 is a defect region of the wafer.

After obtaining the pixel quantity threshold value, the pixel quantity threshold value may be used to perform the seam detection on other wafers, which will be described below.

After Step 112, the same process as Step 100 to Step 104 is performed on the film in the second wafer. In Step 114, the voltage contrast scan is performed on the second wafer to obtain a gray level image. Next, Step 116 is performed, the region positioning process is performed on the gray level image obtained in Step 114, so as to define a plurality of target regions and a seam region located in each target region. Then, Step 118 is performed, the gray level value of each pixel in each seam region is obtained according to the gray level image, and the number of pixels whose gray level values are lower than the gray level threshold value in each seam region is calculated.

Next, in Step 120, whether a seam region is a defect region is determined according to the quantity value (the number of pixels whose gray level values are lower than the gray level threshold value in each seam region) obtained in Step 118. That is, in this step, a seam region having a quantitative value exceeding the pixel quantity threshold value obtained in Step 112 is determined as a defect region causing electrical defects.

In this way, the seam regions can be instantly and quickly determined without taking out the wafer to perform the transmission electron microscope detection. Therefore, through the detection method of the disclosure, the seam detection can be continuously performed on a batch of wafers in the semiconductor production line without stopping the production line, and whether a seam region is a defect region causing electrical defects can be accurately determined. In addition, defects are detected through gray level images without wasting wafers or consuming time.

In addition, in the method for detecting a seam of the disclosure, even if the gray level threshold value needs to be corrected, there is no need to stop the production line and affect the production capacity.

The present invention is suitable for manufacturing miniaturized semiconductor devices, for example, DRAMs, flash memories, or integrated circuits, so as to increase the total number of dies on a wafer. Therefore, the waste, the production cost and energy consumption of manufacturing a single IC are reduced, and the production energy consumption of subsequent packaging is also reduced, thereby reducing carbon emissions in the process of manufacturing semiconductor devices.

Although the disclosure has been disclosed above with the embodiments, the embodiments are not intended to limit the disclosure. Persons with ordinary knowledge in the technical field may make some changes and modifications without departing from the spirit and scope of the disclosure. The scope of protection of the disclosure should be defined by the appended claims.

What is claimed is:

1. A method for detecting a seam in a film, comprising:

performing a following process on a film in a first wafer:

step (a) performing a scan to obtain a gray level image;

step (b) performing a region positioning process on the gray level image to define a plurality of target regions and a seam region located in each of the target regions;

step (c) obtaining a gray level value of each pixel in each of the seam regions, and calculating a number of pixels whose gray level values are lower than a gray level threshold value in each of the seam regions;

step (d) generating a pixel quantity threshold value according to the number in each of the seam regions; and performing step (a) to step (c) on a film in a second wafer, and determining the seam region having the number exceeding the pixel quantity threshold value to be a defect region.

2. The method for detecting a seam in a film according to claim 1, wherein step (d) comprises:

performing electrical detection on the first wafer to obtain an electrical defect distribution diagram; and comparing the electrical defect distribution diagram with the seam region to obtain the pixel quantity threshold value, wherein when the number does not exceed the pixel quantity threshold value, the seam region having the number is determined not to cause electrical defects, and when the number exceeds the pixel quantity threshold value, the seam region having the number is determined to cause electrical defects.

3. The method for detecting a seam in a film according to claim 1, wherein after step (c) and before step (d), the method further comprises:

performing seam detection to obtain seam information; and comparing the seam information with the gray level image.

4. The method for detecting a seam in a film according to claim 3, wherein when the seam information matches the seam region, step (d) is executed.

5. The method for detecting a seam in a film according to claim 3, wherein when the seam information does not match the seam region, the gray level threshold value is adjusted, and the number of pixels whose gray level values are lower than the adjusted gray level threshold value in each of the seam regions is calculated.

6. The method for detecting a seam in a film according to claim 3, wherein the seam detection comprises transmission electron microscope detection, and the scan comprises a voltage contrast scan.

7. The method for detecting a seam in a film according to claim 3, wherein the seam information comprises a seam position.

8. The method for detecting a seam in a film according to claim 1, wherein the film comprises a conductive layer embedded in a dielectric layer, and the conductive layer is the target region.

9. The method for detecting a seam in a film according to claim 8, wherein the conductive layer comprises a polysilicon layer.

10. The method for detecting a seam in a film according to claim 1, wherein the second wafer and the first wafer are wafers manufactured in a same batch.

11. The method for detecting a seam in a film according to claim 1, wherein the region positioning process comprises:

comparing an original design drawing of the film with the gray level image; and defining a boundary of the target region in the gray level image according to a boundary of a polysilicon layer of the original design drawing.

* * * * *